US011333680B2

United States Patent
Jeong

(10) Patent No.: US 11,333,680 B2
(45) Date of Patent: May 17, 2022

(54) PROBE SOCKET

(71) Applicant: LEENO INDUSTRIAL INC., Busan (KR)

(72) Inventor: Jae-hwan Jeong, Busan (KR)

(73) Assignee: LEENO INDUSTRIAL INC.

( * ) Notice: Subject to any disclaimer, the term of this patent is extended or adjusted under 35 U.S.C. 154(b) by 168 days.

(21) Appl. No.: 16/577,073

(22) Filed: Sep. 20, 2019

(65) Prior Publication Data

US 2020/0011895 A1 Jan. 9, 2020

Related U.S. Application Data

(63) Continuation of application No. PCT/KR2018/003270, filed on Mar. 22, 2018.

(30) Foreign Application Priority Data

Apr. 21, 2017 (KR) ........................ 10-2017-0051387

(51) Int. Cl.
    *G01R 1/04*     (2006.01)
    *G01R 1/067*    (2006.01)
    *G01R 1/073*    (2006.01)

(52) U.S. Cl.
    CPC ......... *G01R 1/0466* (2013.01); *G01R 1/0675* (2013.01); *G01R 1/07314* (2013.01)

(58) Field of Classification Search
CPC . G01R 1/0466; G01R 1/0675; G01R 1/07314
See application file for complete search history.

(56) References Cited

U.S. PATENT DOCUMENTS 4,056,299 A * 11/1977 Paige ................... H01R 4/4818
    439/439
5,933,309 A * 8/1999 Smith .................. G01R 27/205
    361/88

(Continued)

FOREIGN PATENT DOCUMENTS

CN       102621360 A     8/2012
JP        2012-159422 A    8/2012

(Continued)

OTHER PUBLICATIONS

English translation of WO2012106220A1 (Year: 2012).*

(Continued)

*Primary Examiner* — Paresh Patel
(74) *Attorney, Agent, or Firm* — Park & Associates IP Law, P.C.

(57) ABSTRACT

A probe socket for inspecting electric characteristics of an object to be tested. The probe socket includes a plurality of power pins for applying power to the object to be tested, a plurality of ground pins arranged in parallel with the power pins, a support block for accommodating and supporting the plurality of power pins or ground pins in parallel, and a conductive plate arranged inside the support block in a direction transverse to lengthwise directions of the power pin and the ground pin and having at least one of a power connection pattern for electrically connecting the plurality of power pins in common and a ground connection pattern for electrically connecting the plurality of ground pins in common.

4 Claims, 8 Drawing Sheets

(56) References Cited

U.S. PATENT DOCUMENTS

| | | | |
|---|---|---|---|
| 2002/0105349 A1* | 8/2002 | Chan | G01R 1/0408 |
| | | | 324/754.07 |
| 2005/0035754 A1 | 2/2005 | Ho et al. | |
| 2008/0088331 A1* | 4/2008 | Yoshida | G01R 1/0466 |
| | | | 324/755.05 |

FOREIGN PATENT DOCUMENTS

| | | |
|---|---|---|
| KR | 10-2006-0052285 A | 5/2006 |
| KR | 10-2008-0063530 A | 7/2008 |
| KR | 10-1095907 B1 | 12/2011 |
| KR | 10-1254180 B1 | 4/2013 |
| KR | 10-2014-0003743 A | 1/2014 |
| TW | M478155 U | 5/2014 |
| WO | 2012106220 A1 | 8/2012 |

OTHER PUBLICATIONS

Korean Office Action (KR 10-2017-0051387), KIPO, dated Apr. 7, 2018.
International Search Report (PCT/KR2018/003270), WIPO, dated Aug. 1, 2018.
Korean Decision to Grant (KR 10-2017-0051387), KIPO, dated Aug. 21, 2018.
Taiwan Office Action (TW 107110372), TIPO, dated Dec. 24, 2018.
Taiwan Notice of Allowance (TW 107110372), TIPO, dated Apr. 26, 2019.
Japanese Office Action (JP 2019-547970), JPO, dated Nov. 4, 2020.
Chinese Office Action (CN 201880020227.9), CNIPA, dated Jan. 21, 2021.

* cited by examiner

PROBE SOCKET

REFERENCE TO RELATED APPLICATIONS

This is a continuation of pending International Patent Application PCT/KR2018/003270 filed on Mar. 22, 2018, which designates the United States and claims priority of Korean Patent Application No. 10-2017-0051387 filed on Apr. 21, 2017, the entire contents of which are incorporated herein by reference.

FIELD OF THE INVENTION

The present disclosure relates to a probe socket improved in resistance and current characteristics.

BACKGROUND OF THE INVENTION

To inspect electric characteristics of a semiconductor and the like device to be tested, a probe socket has been used. Recently, a device to be tested has been decreased in pitch but increased in allowable current. Therefore, resistance and current characteristics in power and ground pins of the probe socket have become very important factors. As shown in FIG. 1, a probe socket 1 includes a support block 10 in which a plurality of power pins 20 and ground pins 30 are inserted. The device to be tested receives power through a power pin group and sinks through a ground pin group. As the number of uses of each pin is increasing, the probe socket 1 is largely increased in resistance since a foreign material (e.g. tin oxide) is accumulated on an upper plunger and a contact tip of the pin or the contact tip is worn out. In result, the current does not smoothly flow, and thus overload (or overcurrent) occurs in some pins, thereby causing a problem of shortening the life of the pin.

FIG. 2 is a view of illustrating current characteristics of a conventional probe socket 1. When the resistance is very high since the upper plunger contact tip of the second pin from the left (i.e. a ground pin 30-1) among a plurality of ground pins 30-1 to 30-4 grouped into one accumulates a foreign material or is worn out, the dead ground pin 30-1 may cause the other ground pins 30-2 to 30-4 to be overloaded within one group. In result, a failure of one ground pin 30-1 overloads the other ground pins 30-2 to 30-4, and thus shortens the life of the whole group.

SUMMARY OF THE INVENTION

The present disclosure is conceived to solve the foregoing problems, and provides a probe socket, in which a plurality of power pins or a plurality of ground pins combined as a group is improved in resistance and current characteristics to thereby extend the life of the power pin or the ground pin.

In accordance with an embodiment of the present disclosure, a probe socket is disclosed. The probe socket includes: a plurality of power pins configured to be in contact with power terminals of the object to be tested; a support block configured to accommodate and support the plurality of power pins in parallel; and a conductive plate arranged inside the support block in a direction transverse to a lengthwise direction of the power pin and having a power connection pattern to electrically connect the plurality of power pins in common. In the probe socket according to the present disclosure, even though there is a trouble in a certain power pin among the plurality of power pins, the power pin having the trouble is still usable through the conductive plate for common connection, thereby extending the life of the other power pins within one group.

The probe socket may further include a plurality of ground pins configured to be in contact with ground terminals of the object to be tested, and supported in the support block, wherein the conductive plate is arranged inside the support block in a direction transverse to a lengthwise direction of the ground pin and having a ground connection pattern to electrically connect the plurality of ground pins in common. In the probe socket according to the present disclosure, even though there is a trouble in a certain ground pin among the plurality of ground pins, the ground pin having the trouble is still usable through the conductive plate for common connection, thereby extending the life of the other ground pins within one group.

The power connection pattern or the ground connection pattern may be arranged on an insulation sheet.

The conductive plate may include a first conductive plate having the power connection pattern, and a second conductive plate having the ground connection pattern.

The power connection pattern or the ground connection pattern may include a power contact through hole or a ground contact through hole, with which the power pin or the ground pin is in electric contact while passing therethrough.

The power connection pattern or the ground connection pattern may include a plurality of contact portions protruding toward the center of the power contact through hole or ground contact through hole.

The power contact through hole or the ground contact through hole may be shaped like one among a clover, a star, a cross, a circle, and a polygonal shape.

The power contact through hole or the ground contact through hole may have a diameter smaller than an outer diameter of the power pin or the ground pin.

According to the present invention, a plurality of power pins or a plurality of ground pins combined as a group is improved in resistance and current characteristics to thereby extend the life of the power pin or the ground pin.

DETAILED DESCRIPTION OF THE INVENTION

Below, a probe socket 100 according to embodiments of the present disclosure will be described with reference to the accompanying drawings.

Figure 1:
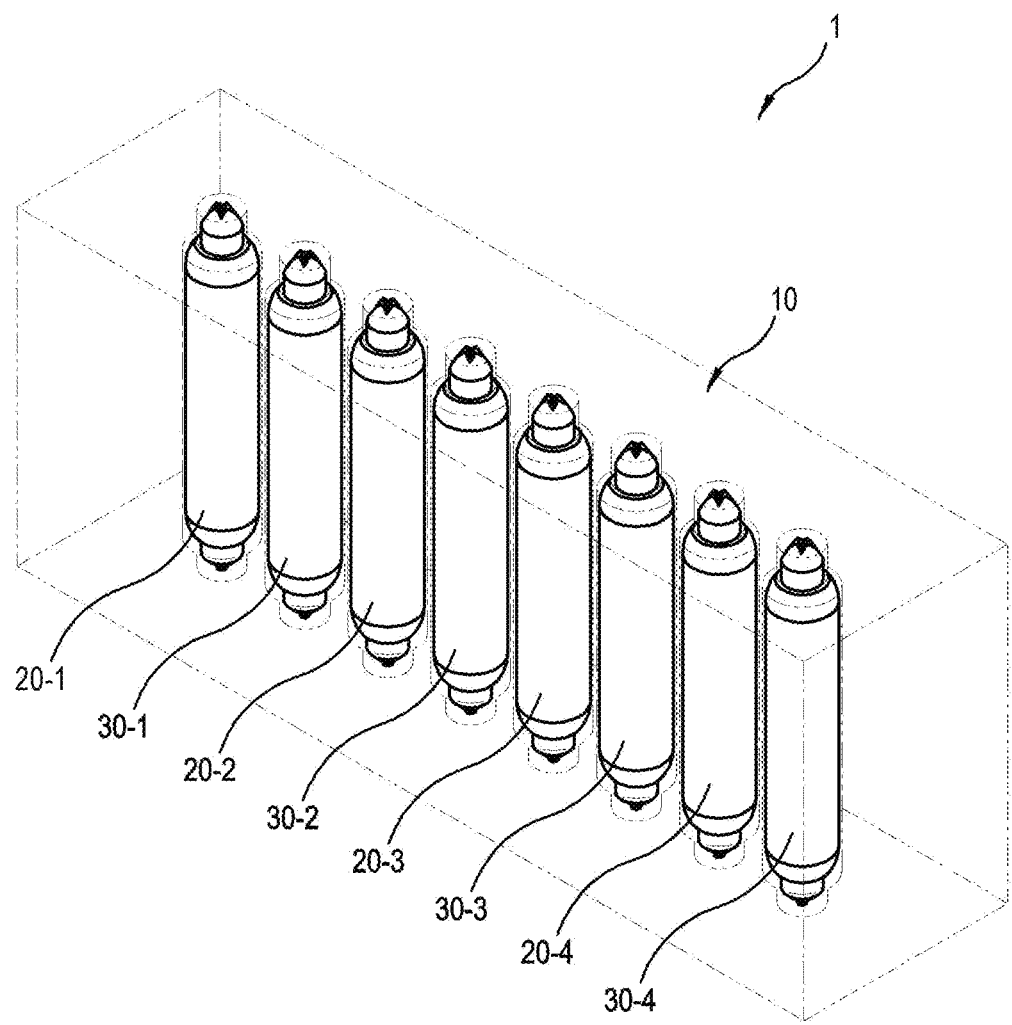
FIG. 1 is a perspective view of a conventional probe socket.
Figure 2:
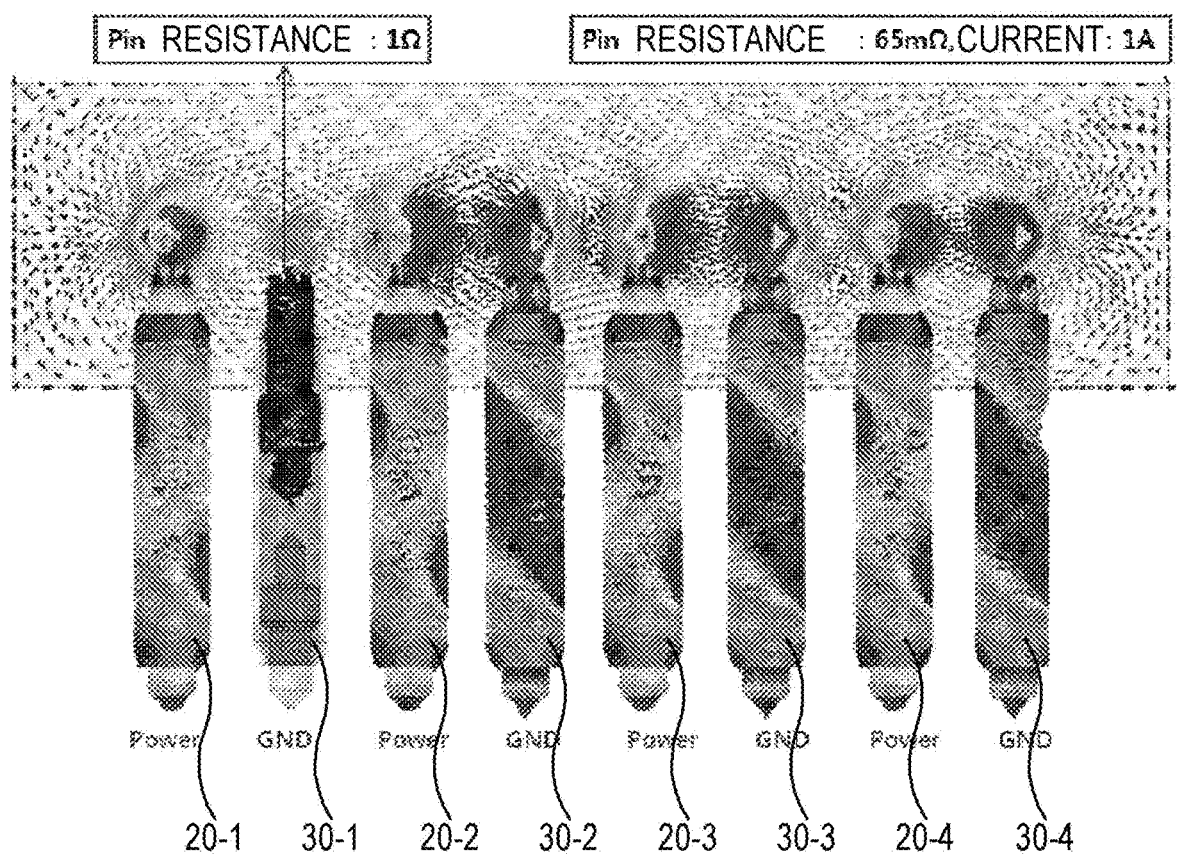
FIG. 2 is a view of showing current characteristics in the probe socket of FIG. 1.
Figure 3:
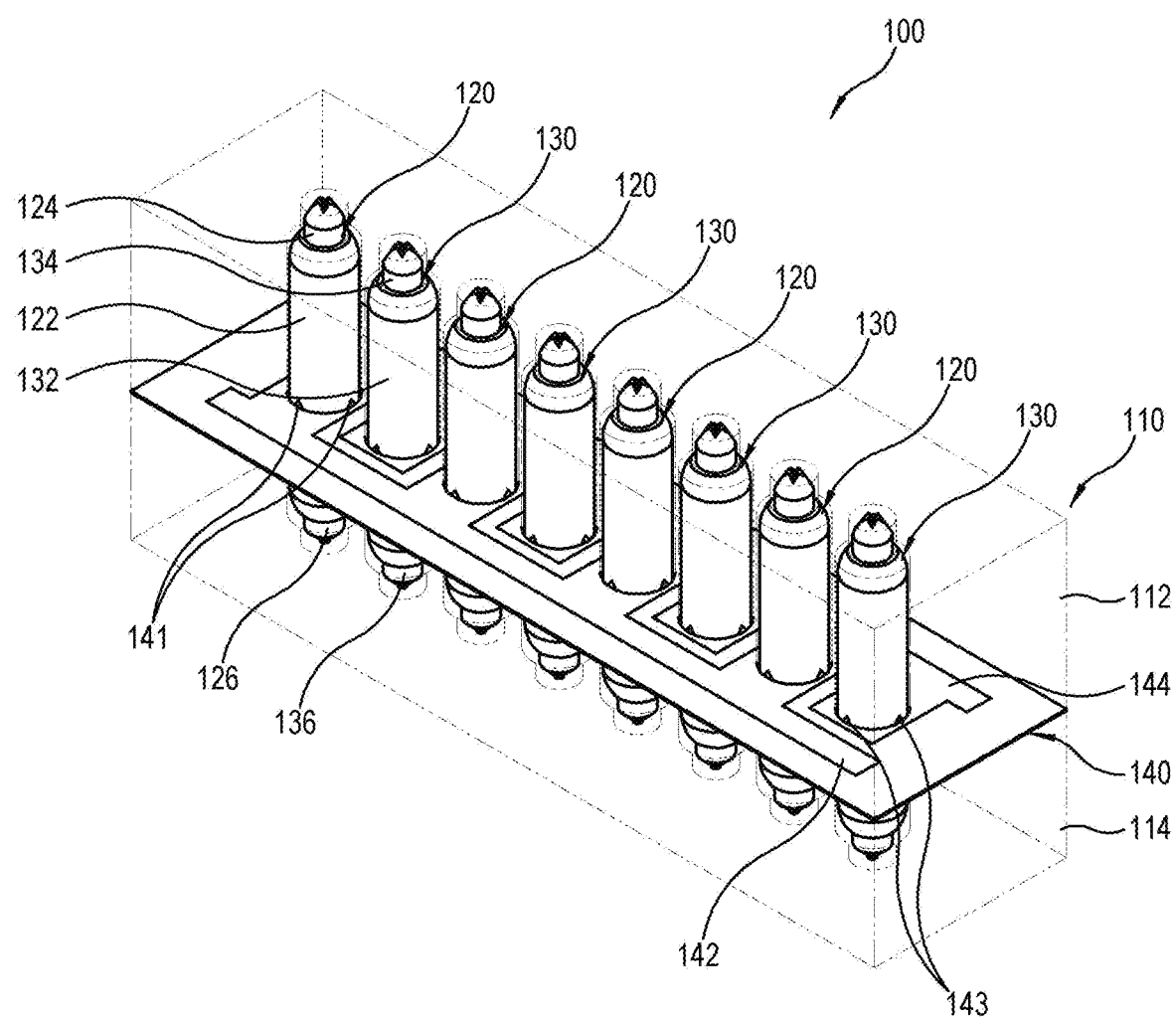
FIGS. 3 and 4 are a perspective view and a cross-sectional view of a probe socket according to an embodiment of the present disclosure, respectively.
Figure 4:
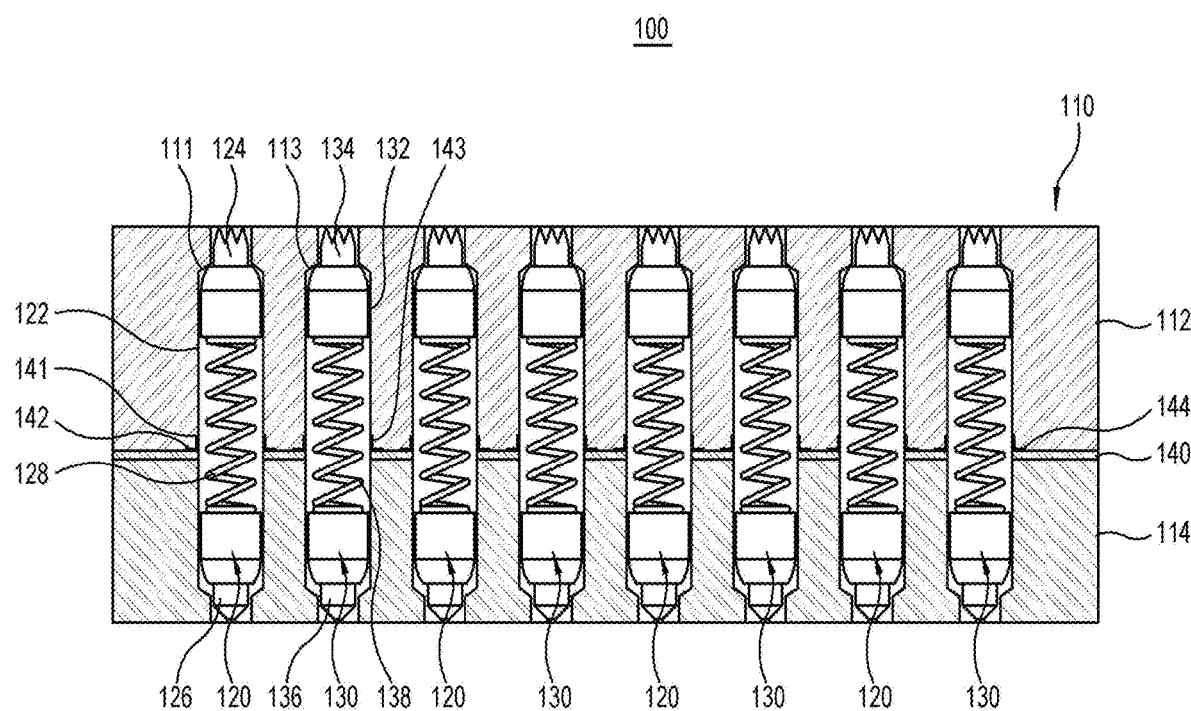

FIGS. 3 and 4 are a perspective view and a cross-sectional view of a probe socket 100 according to an embodiment of the present disclosure, respectively. The probe socket 100 includes a support block 110, a plurality of power pins 120 for applying power to an object to be tested, a plurality of ground pins 130 arranged in parallel with the power pins 120, and a conductive plate 140 having a power connection pattern 142 for electrically connecting the plurality of power pins 120 and a ground connection pattern 144 for electrically connecting the plurality of ground pins 130. Although it is omitted in FIGS. 3 and 4, the probe socket 100 further includes a plurality of signal pins (not shown) for applying a test signal for inspection. For convenience of description, in FIGS. 3 and 4, only eight pins are illustrated as an example of the plurality of power pins 120 and the plurality of ground pins 130 which are alternately arranged. The number and arrangement of power pins 120 and ground pins 130 are varied depending on the kind of object to be tested. For example, a plurality of power terminals and a plurality of ground terminals in a semiconductor and the like object to be tested are applied with power and ground voltage as they are each grouped in units of a predetermined number.

The support block 110 may be made of an insulating material such as plastic, ceramic, etc. The support block 110 includes a plurality of power pin receiving holes 111 for receiving a plurality of power pins 120, and a plurality of ground pin receiving holes 113 for receiving a plurality of ground pins 130. The support block 110 is manufactured to be dividable into an upper support block 112 and a lower support block 114 which are coupled inserting the plurality of power pins 120 and the plurality of ground pins 130 therein, and between which the conductive plate 140 (to be described later) is interposed. Although it is not illustrated, the upper support block 112 and the lower support block 114 may be coupled by various means such as a bolt (not shown) and a nut (not shown), etc.

The power pin 120 applies power for inspection to a power terminal of an object to be tested. The power pin 120 may be for example provided in the form of a pogo pin as shown in FIG. 4, and includes a hollow barrel 122, an upper plunger 124 partially inserted in an upper portion of the barrel 122, a lower plunger 126 partially inserted in a lower portion of the barrel 122, and a spring 128 interposed between the upper plunger 124 and the lower plunger 126 inside the barrel 122.

The ground pin 130 is applied with the ground voltage through the ground terminal of the object to be tested after the power for inspection is applied to the object to be tested. The ground pin 130 has a structure similar to that of the power pin 120, and, as shown in FIG. 4, includes a hollow barrel 132, an upper plunger 134 partially inserted in an upper portion of the barrel 132, a lower plunger 136 partially inserted in a lower portion of the barrel 132, and a spring 138 interposed between the upper plunger 134 and the lower plunger 136 inside the barrel 132.

The power pin 120 and the ground pin 130 provided in the form of the pogo pins are only for illustrative purpose. Alternatively, various pins other than the pogo pin may be employed.

Figure 5:
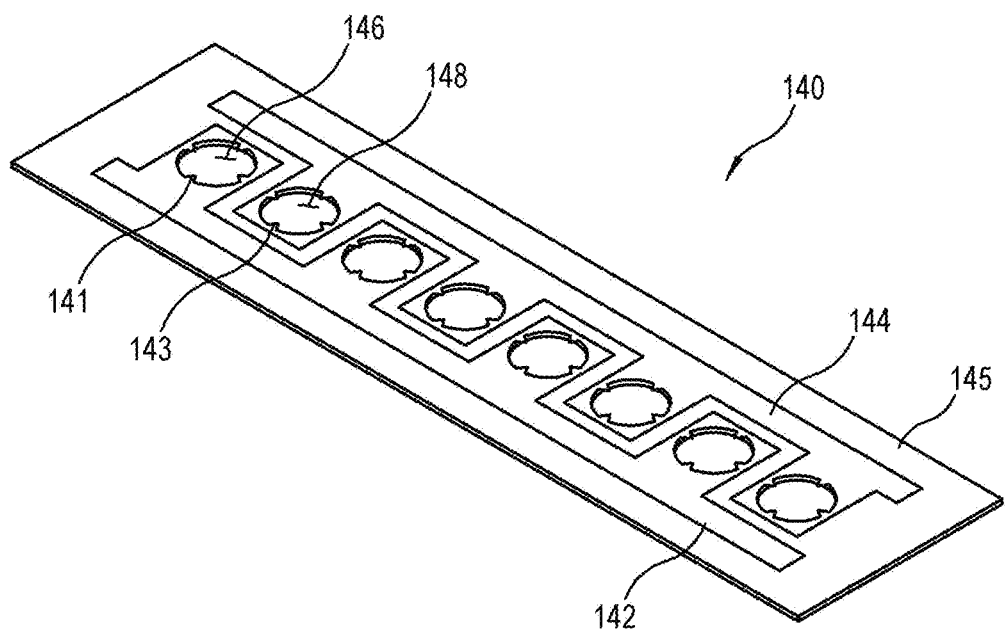
FIG. 5 is a view of illustrating a conductive plate applied to the probe socket according to an embodiment of the present disclosure.

FIG. 5 is a perspective view of illustrating a structure of a conductive plate 140 according to an embodiment of the present disclosure. The conductive plate 140 is arranged in the support block 110 in a direction transverse to the power pin 120 and the ground pin 130. The conductive plate 140 may be materialized by a flexible printed circuit board (FPCB) or a printed circuit board (PCB). The conductive plate 140 includes the power connection pattern 142 arranged on an insulation sheet 145 and connecting the plurality of power pins 120 in common, and a ground connection pattern 144 arranged on the insulation sheet 145 and connecting the plurality of ground pins 130 in common. The conductive plate 140 may be materialized by a conductive film plated or coated on the surface of the upper support block 112 and/or the lower support block 114. The conductive plate 140 given as such a conductive film may be extended to an inner wall of the power pin receiving hole 111 and/or the ground pin receiving hole 113.

Figure 7A:
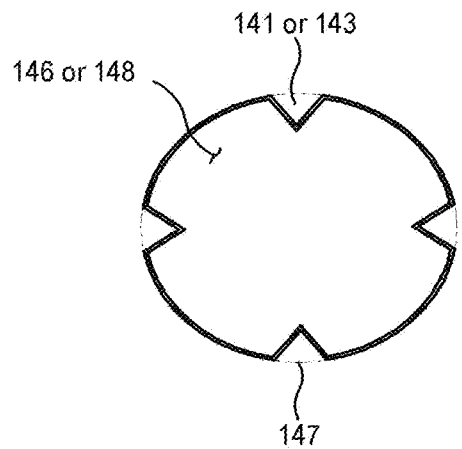
FIGS. 7A to 7C are vies of illustrating shapes of a power contact through hole or a ground contact through hole through which a power pin or a ground pin passes.
Figure 7B:
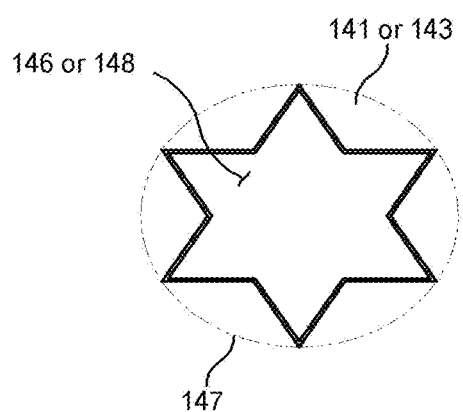
Figure 7C:
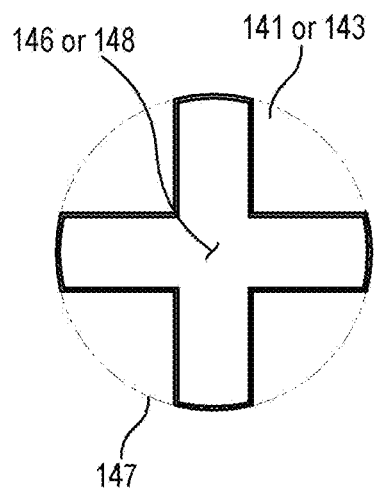

The power connection pattern 142 includes a power contact through hole 146 in which the plurality of power pin 120 penetratingly inserted. The power contact through hole 146 has a non-circular shape, for example, a clover shape, a star shape and a cross shape as shown in FIGS. 7A, 7B and 7C, respectively. In FIGS. 7A, 7B and 7C, the circular line 147 corresponds to an outer diameter the barrel of the power pin 120. In result, when the power pin 120 having the cylindrical barrel 122 is inserted in the noncircular power contact through hole 146, conductive protrusions 141 are bent along with the insertion or previously bent and thus in surface-contact with the outer circumference of the barrel 122. Like this, at least, the power contact through hole 146 has a diameter smaller than the outer diameter of the barrel of the power pin 120. Although it is not illustrated in FIGS. 7A, 7B and 7C, the power contact through hole 146 may have a circular shape, a polygonal shape, etc.

The ground connection pattern 144 is arranged in parallel with the power connection pattern 142, leaving the plurality of power contact through hole 146 in between. The ground connection pattern 144 includes a ground contact through hole 148 in which the plurality of ground pin 130 is penetratingly inserted. Like the power contact through hole 146, the ground contact through hole 148 has a non-circular shape, for example, a clover shape, a star shape and a cross shape as shown in FIGS. 7A, 7B and 7C, respectively. In FIGS. 7A, 7B and 7C, the circular line 147 corresponds to an outer diameter the barrel of the ground pin 130. In result, when the ground pin 130 having the cylindrical barrel 132 is inserted in the noncircular ground contact through hole 148, conductive protrusions 143 are bent and thus in surface-contact with the outer circumference of the barrel 132. Although it is not illustrated in FIGS. 7A, 7B and 7C, the ground contact through hole 148 may have a circular shape, a polygonal shape, etc.

The electric connection between the power connection pattern 142 or the ground connection pattern 144 and the power pin 120 or the ground pin 130 may be achieved by a separate cylindrical contact device (not shown) or a conductive through hole (not shown) instead of the surface contact using the conductive protrusions 141 or 143.

Figure 6:
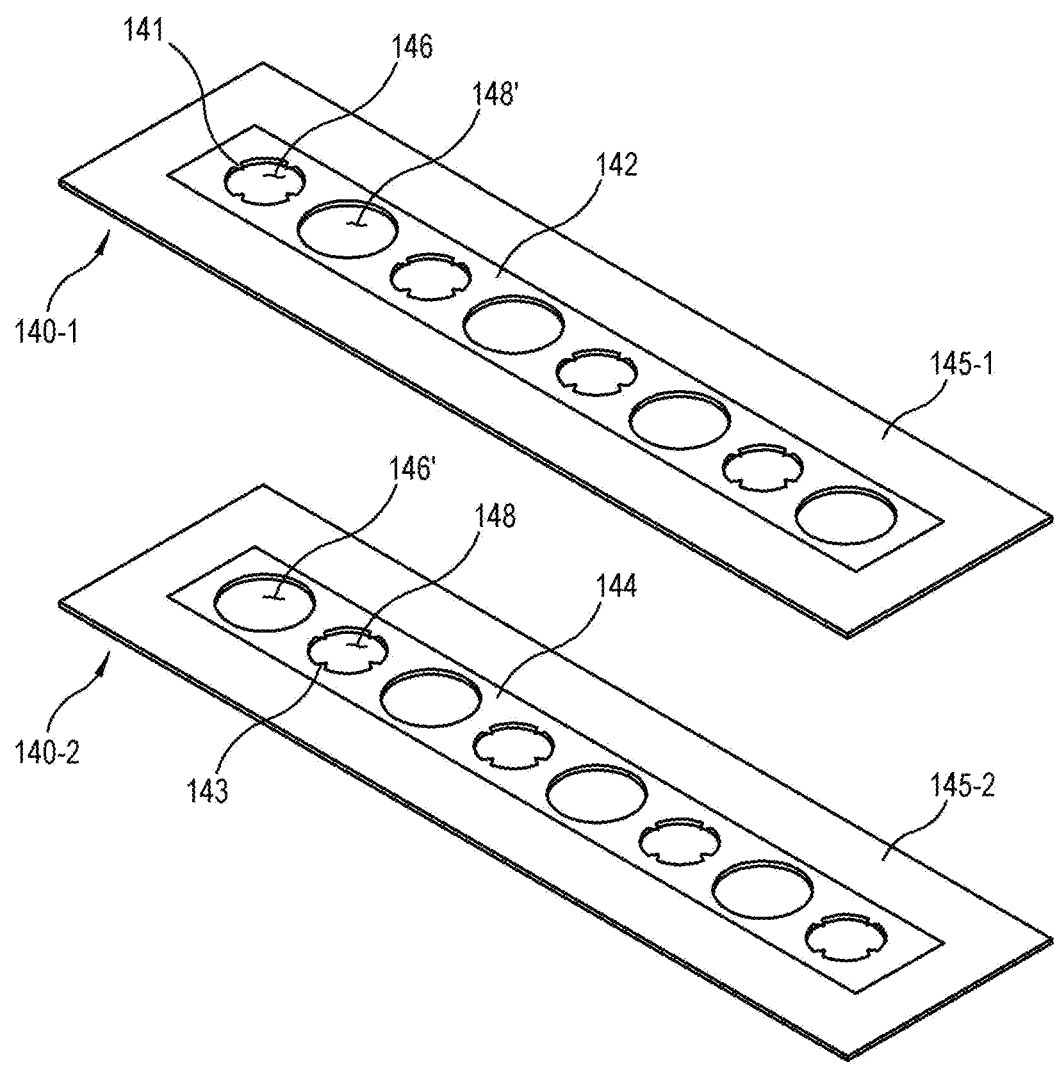
FIG. 6 is a view of illustrating a conductive plate applied to a probe socket according to another embodiment of the present disclosure.

FIG. 6 is a view of illustrating a conductive plate 140 according to another embodiment of the present disclosure. The conductive plate 140 may be materialized by a flexible printed circuit board (FPCB) or a printed circuit board (PCB). The conductive plate 140 includes a first conductive plate 140-1 for connecting the power pins 120 in common, and a second conductive plate 140-2 for connecting the ground pins 130 in common. The first conductive plate 140-1 and the second conductive plate 140-2 are stacked and inserted in the support block in a direction transverse to the power pin 120 and the ground pin 130.

The first conductive plate 140-1 includes a power connection pattern 142 arranged on a first insulation sheet 145-1 to connect the plurality of power pins 120 in common. The power connection pattern 142 includes power contact through holes 146 in which the plurality of power pins 120 is penetratingly inserted, and a ground pin through hole 148' in which the ground pin 130 is inserted without contact. The power contact through hole 146 has a noncircular shape, for example, a clover shape, a star shape, and a cross shape as shown in FIG. 7. In FIG. 7, the circular line 147 corresponds to the outer diameter of the barrel the power pin 120. In result, when the power pin 120 having the cylindrical barrel 122 is inserted in the non-circular power contact through hole 146, conductive protrusions 141 are bent and thus in surface contact with the outer circumference of the barrel 122. In this case, the ground pin through hole 148' is larger than the barrel 132 of the ground pin 130 so as not to contact the outer surface of the ground pin 130.

The second conductive plate 140-2 includes a ground connection pattern 144 arranged on a first insulation sheet 145-2 to connect the plurality of ground pins 130 in common. The ground connection pattern 144 includes ground contact through holes 148 in which the plurality of ground pins 130 is penetratingly inserted, and a power pin through hole 146' in which the power pin 120 is inserted without contact. The ground contact through hole 148 has a noncircular shape, for example, a clover shape, a star shape, and a cross shape as shown in FIGS. 7A to 7C. In FIGS. 7A to 7C, the circular line 147 corresponds to the outer diameter of the barrel the ground pin 130. In result, when the ground pin 130 having the cylindrical barrel 132 is inserted in the non-circular ground contact through hole 148, conductive protrusions 143 are bent and thus in surface contact with the outer circumference of the barrel 132. In this case, the power pin through hole 146' is larger than the outer diameter of the barrel 122 of the power pin 120 so as not to be in contact with the power pin 120.

Figure 8:
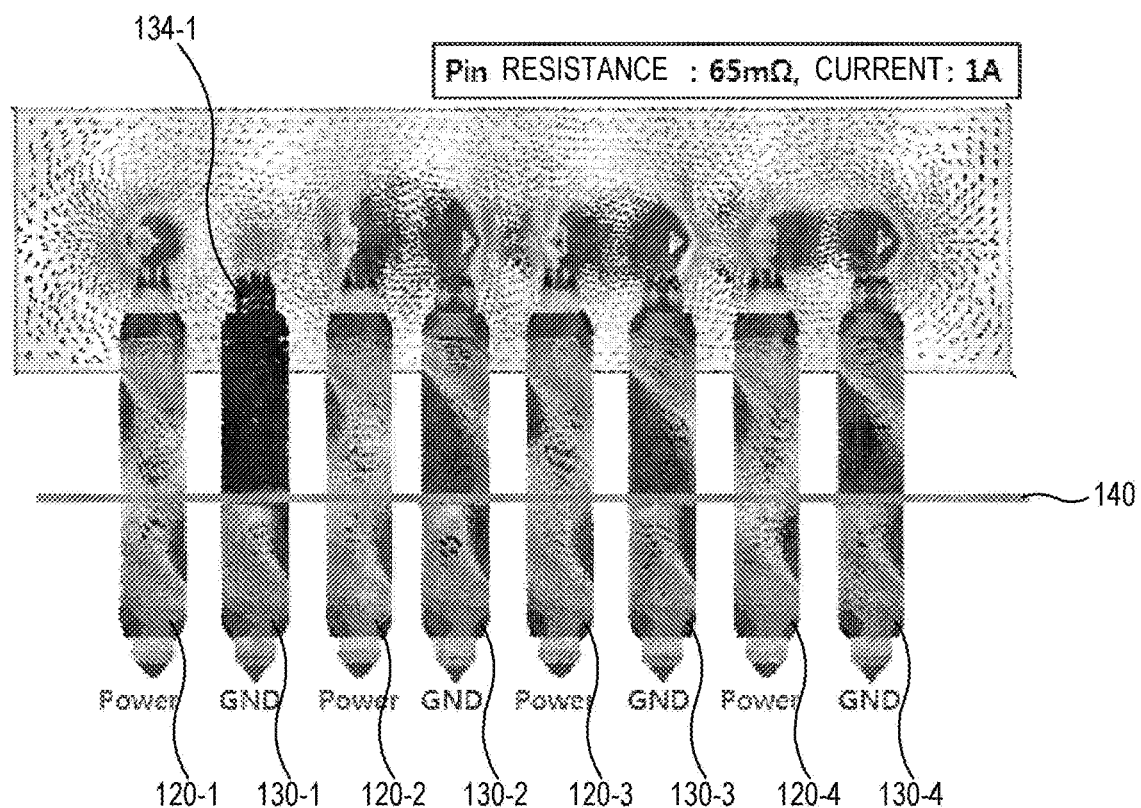
FIG. 8 is a view of showing current characteristics in the probe socket of FIG. 3.

FIG. 8 is a view of showing current characteristics in the probe socket 100 according to one embodiment of the present disclosure. As shown therein, unlike the conventional probe socket, when resistance largely increases as the upper plunger contact tip of the first ground pin 130-1 accumulates foreign materials or is worn out, the ground voltage may be applied from the ground terminal of the object to be tested to the first ground pin 130-1 via the other ground pins 130-2 to 130-4 and the conductive plate 140. In result, even when a contact failure occurs in the first ground pin 130-1, the overload applied to the other ground pins 130-2 to 130-4 is distributed.

As described above, even when contact resistance is largely increased in a power pin or a ground pin since a contact tip of an upper plunger to be in contact with a contact point of a test object accumulates foreign material or the contact tip is worn out, the probe socket of the present disclosure prevents the other power pins or ground pins within one group from being deteriorated in resistance or current characteristics, and thus extends the life of the power pin or ground pin.

Although a few exemplary embodiments have been shown and described, it will be appreciated by those skilled in the art that changes may be made in these exemplary embodiments without departing from the principles and spirit of the disclosure.

Therefore, the scope of the present disclosure has to be not limited to the foregoing exemplary embodiments but defined in the appended claims and their equivalents.

What is claimed is:

1. A probe socket for inspecting electric characteristics of an object to be tested, the probe socket comprising:

a support block formed with an upper support block and a lower support block coupled together, the upper and lower support blocks each comprising a plurality of power pin receiving holes formed in vertical alignment with one another for accommodating and supporting a plurality of power pins in parallel, the power pins configured to be in contact with power terminals of the object to be tested, and a plurality of ground pin receiving holes formed in vertical alignment with one another for accommodating and supporting a plurality of ground pins in parallel, the ground pins configured to be in contact with ground terminals of the object to be tested; and a conductive plate interposed between upper and lower support blocks and extending in a direction transverse to a lengthwise direction of the power pins, the conductive plate including a power connection pattern to electrically connect the plurality of power pins in common, and a ground connection pattern to electrically connect the plurality of ground pins in common, wherein the conductive plate is formed with an insulation sheet on which the power connection pattern and the ground connection pattern are arranged, wherein the power connection pattern and the ground connection pattern comprise a plurality of power contact through holes and a plurality of ground contact through holes, respectively, to which the power pins and the ground pins are in electric contact while passing therethrough, wherein the conductive plate includes the power connection pattern arranged on a first side of the insulation sheet, and the ground connection pattern arranged on a second side of the insulation sheet, wherein the power connection pattern includes a base portion extending in a longitudinal direction of the insulation sheet, and protruded portions protruded at regular interval in a direction transverse from the extending direction of the base portion, wherein the ground connection pattern includes a base portion at an opposite side from the base portion of the power connection pattern and extending in a longitudinal direction of the insulation sheet, and protruded portions protruded at regular interval in a direction transverse from the extending direction of the base portion, in opposite direction from that of the protruded direction of the protruded portions of the power connection pattern, such that the protruded portions of the power connection pattern and the protruded portions of the ground connection pattern are arranged in alternating manner.

2. The probe socket according to claim 1, wherein the power connection pattern and the ground connection pattern comprise a plurality of contact portions protruding toward the center of the power contact through hole and ground contact through hole, respectively.

3. The probe socket according to claim 1, wherein the power contact through holes and the ground contact through holes each have a shape selected from a clover, a star, a cross, a circle, and a polygonal shape.

4. The probe socket according to claim 1, wherein the power contact through holes and the ground contact through holes each have a diameter smaller than an outer diameter of the power pins and the ground pins.

\* \* \* \* \*